United States Patent
Ito

(10) Patent No.: US 6,274,439 B1
(45) Date of Patent: *Aug. 14, 2001

(54) PROCESS FOR FABRICATING SEMICONDUCTOR DEVICE WITH FIELD EFFECT TRANSISTOR CHANGEABLE IN THRESHOLD VOLTAGE WITH HYDROGEN ION AFTER FORMATION OF WIRINGS

(75) Inventor: Shinya Ito, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/020,055

(22) Filed: Feb. 6, 1998

(30) Foreign Application Priority Data

Feb. 6, 1997 (JP) .................................... 9-023571

(51) Int. Cl.⁷ ................................. H01L 21/8236
(52) U.S. Cl. ............................ 438/278; 438/290
(58) Field of Search .................... 438/217, 275, 438/276, 277, 278, 289, 290, 291

(56) References Cited

U.S. PATENT DOCUMENTS

| 4,272,303 | * | 6/1981 | Chatterjee et al. | 438/275 |
| 5,091,328 | * | 2/1992 | Miller | 438/290 |

FOREIGN PATENT DOCUMENTS

| 63-299277 | 12/1988 | (JP) . |
| 4-196215 | 7/1992 | (JP) . |
| 5-102471 | 4/1993 | (JP) . |
| 5-251378 | 9/1993 | (JP) . |
| 8-250721 | 9/1996 | (JP) . |

OTHER PUBLICATIONS

Ghandhi, "VLSI Fabrication Principles, Silicon and Gallium Arsenide", pp. 325–328, 1983.*

Brower, K.L., "Kinetics of $H_2$ passivation of $P_b$ centers at the (111) Si–$SiO_2$ Interface", *Physical Review B*, The American Physical Society, vol. 38, No. 14, Nov. 15 1988–1, pp, 9657–9666.

Pearton, S.J. et al., "Hydrogen in Crystalline Semiconductors", Applied Physics A 43, 153–195 (1987).

\* cited by examiner

*Primary Examiner*—Chandra Chaudhari
(74) *Attorney, Agent, or Firm*—Hutchins, Wheeler & Dittmar

(57) ABSTRACT

After completion of wiring strips on an inter-level insulating structure, a field effect transistor is checked to see whether or not the threshold voltage falls within a design range, if the threshold voltage is out of the design range, hydrogen ion is implanted through the inter-level insulating structure, the gate electrode and the gate insulating layer into the channel region of the field effect transistor, and the resultant semiconductor structure is annealed at 400 degrees in centigrade for 20 minutes so as to partially deactivate the dopant impurity in the channel region.

24 Claims, 12 Drawing Sheets

PROCESS FOR FABRICATING SEMICONDUCTOR DEVICE WITH FIELD EFFECT TRANSISTOR CHANGEABLE IN THRESHOLD VOLTAGE WITH HYDROGEN ION AFTER FORMATION OF WIRINGS

FIELD OF THE INVENTION

This invention relates to a fabrication technology for a semiconductor device and, more particularly, to a process for fabricating a semiconductor device with field effect transistors changeable in threshold voltage with hydrogen ion after formation of wiring strips on an inter-level insulating structure.

DESCRIPTION OF THE RELATED ART

It is very important to precisely control the threshold voltage of a field effect transistor. When the threshold voltage is as close to a design value as possible, the field effect transistor exhibits the design transistor characteristics such as the switching speed and the amount of leakage current. Various factors affect the threshold voltage, and are, by way of example, the thickness of the gate insulating layer, the width of the gate electrode and the amount of dopant impurity introduced in the channel region. These factors tend to fluctuate during the fabrication process. With the decrease in the size of field effect transistor is getting smaller and smaller, the control of fluctuation becomes very difficult. The manufacturer can evaluate the field effect transistors only after a metal wiring structure is formed over the field effect transistors. If it is possible to correct the threshold voltage after the metallization according to the measured value, the manufacturer rescues defective field effect transistors from rejection, and the production yield is improved.

Field effect transistors different in threshold voltage are usually incorporated in a semiconductor integrated circuit device. When leakage current is needed to be low, the threshold voltage of field effect transistor is set at a high value. On the other hand, a high-speed field effect transistor is designed to have low threshold voltage. A mask ROM (read only memory) device has memory cells selectively programmed in logic "1" level and logic "0" level, and the memory cell is implemented by a field effect transistor. The two logic levels are corresponding to a high threshold voltage and a low threshold voltage. For this reason, the manufacturer selectively gives the high threshold voltage and the low threshold voltage to the memory cell transistors. If the threshold voltage is changed after the completion of the multi-layered wiring structure, the manufacturer can deliver the mask ROM devices within short time period.

The dopant concentration in the channel region determines the threshold voltage of the field effect transistor, and boron or phosphorous is ion implanted into the channel region. FIGS. 1A to 1C illustrate the prior art process of fabricating an n-channel type field effect transistor. The prior art process shown in FIGS. 1A to 1C is hereinbelow referred to as "first prior art process". The threshold voltage of a field effect transistor is determined through a channel doping before formation of an inter-level insulating structure.

The first prior art process starts with preparation of a p-type silicon substrate 1 or a p-type well. A thick field oxide layer (not shown) is selectively grown on the major surface of the p-type silicon substrate 1, and defines an active area assigned to the n-channel type field effect transistor. Boron is ion implanted into the active area, and forms a doped channel region 2 as shown in FIG. 1A.

Subsequently, a surface portion of the active area is oxidized so as to cover the active area with a gate oxide layer 3. Conductive material is deposited over the entire surface of the resultant structure, and the conductive layer is patterned into a gate electrode 4. N-type dopant impurity is ion implanted into the active area, and forms lightly doped impurity regions (not shown) in a self-aligned manner with the gate electrode 4. Insulating material is deposited over the entire surface of the resultant structure, and the insulating layer is etched without any etching mask. As a result, side wall spacers 5 are left on the side surfaces of the gate electrode 4 as shown in FIG. 1B. N-type dopant impurity is ion implanted into the active area, and form heavily-doped impurity regions (not shown) in a self-aligned manner with the side wall spacers 5. The heavily-doped impurity regions are nested in the lightly-doped impurity regions, and the heavily-doped impurity regions and the lightly-doped impurity regions form n-type source/drain regions (not shown). The doped channel region 2, the gate insulating layer 3, the gate electrode 4, the side wall spacers 5 and the n-type source/drain regions as a whole constitute the n-channel type field effect transistor.

Subsequently, silicon oxide and boro-phosphosilicate glass are successively deposited over the entire surface of the resultant semiconductor structure, and form a silicon oxide layer 6 and a boro-phosphosilicate glass layer 7 over the n-channel type field effect transistor. The silicon oxide layer 6 and the boro-phosphosilicate glass layer 7 form in combination an inter-level insulating structure 8.

Contact holes 8a/8b are formed in the inter-level insulating structure 8, and the n-type source/drain regions are exposed to the contact holes 8a/8b, respectively. The contact holes 8a/8b are plugged with conductive pieces 9a/9b, and conductive wiring strips 10a/10b are patterned on the inter-level insulating structure 8 as shown in FIG. 1C. Thus, the dopant concentration in the channel region 2 is determined before completion of the inter-level insulating structure.

FIGS. 2A to 2C illustrate another prior art process, which is hereinbelow referred to as "second prior art process". The threshold voltage of a field effect transistor is changed after completion of an inter-level insulating structure.

The second prior art process starts with preparation of a p-type silicon substrate 21 or a p-type well. A thick field oxide layer 22 is selectively grown on the major surface of the p-type silicon substrate 21. A channel doping is carried out with boron for forming a doped channel region 22, and lightly-doped impurity regions (not shown) and heavily-doped impurity regions (not shown) are formed in the self-aligned manner with the gate electrodes 24 on gate insulating layers 25 and side wall spacers 26. A silicon oxide layer 27 and a boro-phosphosilicate glass layer 28 are deposited over the field effect transistors, and form in combination an inter-level insulating structure 29. Contact holes 28a, 28b, 28c and 28d are formed in the interlevel insulating structure 29, and the heavily-doped impurity regions are exposed to the contact holes 28a to 28d, respectively. The contact holes 28a to 28d are plugged with conductive pieces 30a, 30b, 30c and 30d as shown in FIG. 2A.

A photo-resist ion-implantation mask 31 is formed on the inter-level insulating structure 29, and is located over the right field effect transistor. Phosphorous is ion implanted into the doped channel region 23 uncovered with the photo-resist ion-implantation mask 31 at the dosage of $1\times10^{14}$ $cm^{-2}$ under acceleration energy of 1 MeV as shown in FIG. 2B. The phosphorous is activated through an annealing at 800 degrees or higher than 800 degrees in centigrade. The phosphorous is concentrated into the doped channel region 23a, and cancels the effect of the boron ion implanted before the fabrication of the inter-level insulating structure 29. The ion-implanted phosphorus lowers the threshold voltage of the left field effect transistor. Thus, the left field effect transistor has the low threshold voltage, and the right field effect transistor has the high threshold voltage. The ion-implantation at this stage is hereinbelow referred to as "second channel doping".

Finally, conductive wiring strips 32a, 32b, 32c and 32d are patterned on the inter-level insulating structure 29, and are held in contact with the conductive plugs 30a to 30d, respectively, as shown in FIG. 2C.

The first prior art process encounters a problem in that the threshold voltage is uncorrectable upon completion of the field effect transistor. As described hereinbefore, the manufacturer checks the field effect transistor to see whether or not the threshold voltage falls within a design range, and the manufacturer merely disposes of the field effect transistor with a threshold voltage out of the design range.

On the other hand, the second prior art process allows the manufacturer to correct the threshold voltage. The ion-implantation for the second channel doping requires the heat treatment at 800 degrees in centigrade or higher than 800 degrees in centigrade. The ion-implanted phosphorous is activated through the high-temperature heat treatment, and the crystal defects are simultaneously cured. However, the high-temperature heat treatment deteriorates the field effect transistors. Thus, the high-temperature heat treatment is undesirable from the aspect of the reliability of the field effect transistors. Moreover, the second channel doping is impossible after the metallization. Finally, if the manufacturer needs to change the threshold voltage for not only the n-channel type field effect transistors but also the p-channel type field effect transistor, the second channel doping is repeated twice, and the lithography for the mask 31 is also repeated twice. This results in a complicated process sequence.

SUMMARY OF THE INVENTION

It is therefore an important object of the present invention to provide a process of fabricating a semiconductor device, in which a manufacturer can change the threshold voltage of field effect transistors after formation of wiring strips on an inter-level insulating structure without deterioration of the field effect transistors.

To accomplish the object, the present invention proposes to partially deactivate dopant impurity in a channel region by using hydrogen ion.

In accordance with one aspect of the present invention, there is provided a process of fabricating a semiconductor device including a field effect transistor, and the process comprises the steps of preparing a semiconductor substrate, assigning a surface area of the semiconductor substrate to the field effect transistor, fabricating the field effect transistor having a threshold voltage controlled with hydrogen ion and completing the semiconductor device including the field effect transistor.

BRIEF DESCRIPTION OF THE DRAWINGS

The features and advantages of the process will be more clearly understood from the following description taken in conjunction with the accompanying drawings in which.

DIFFERENCE FROM KNOWN HYDROGEN ANNEALING

Figure 1A:
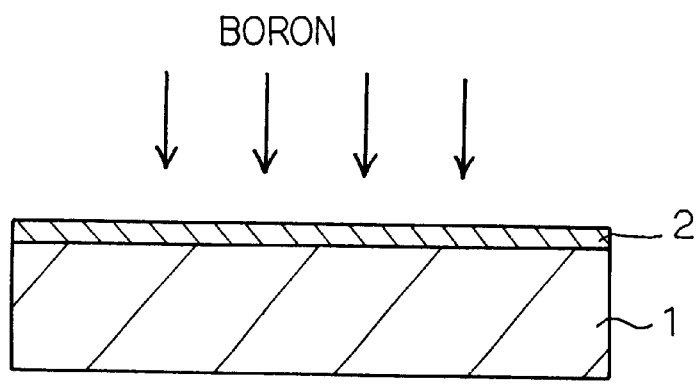
FIGS. 1A to 1C are cross sectional views showing the first prior art process of fabricating an n-channel type field effect transistor.
Figure 1B:
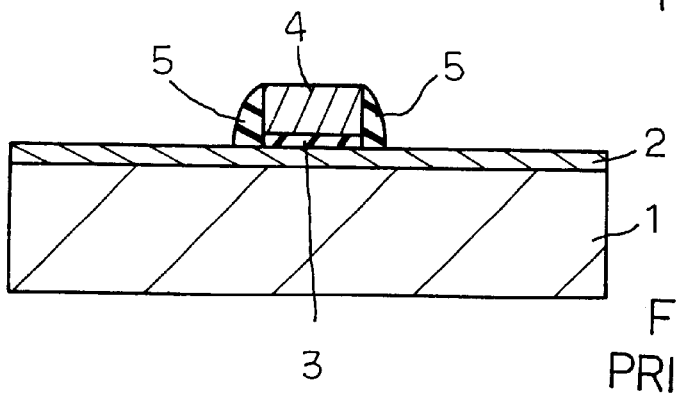
Figure 1C:
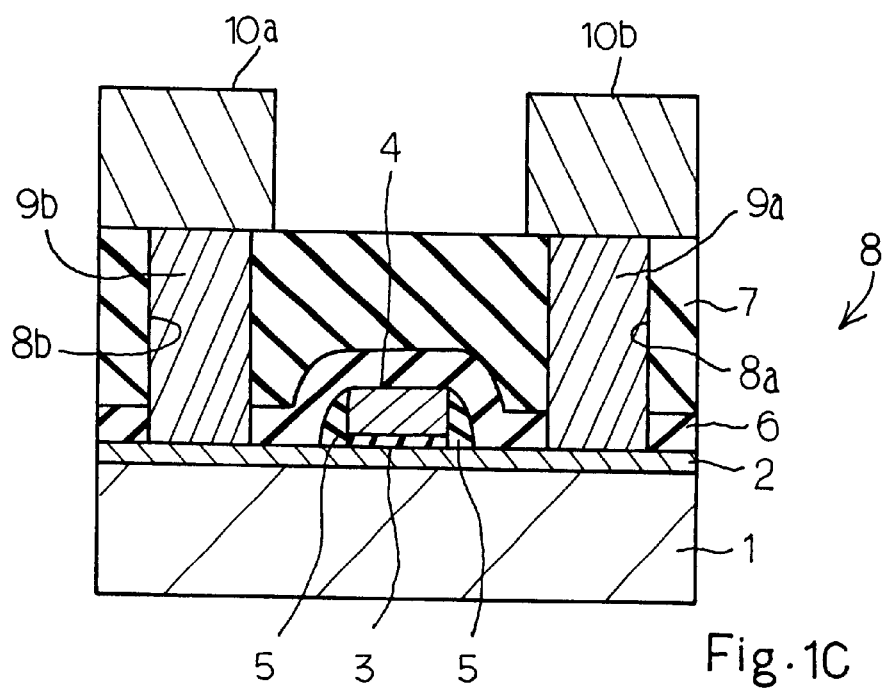
Figure 2A:
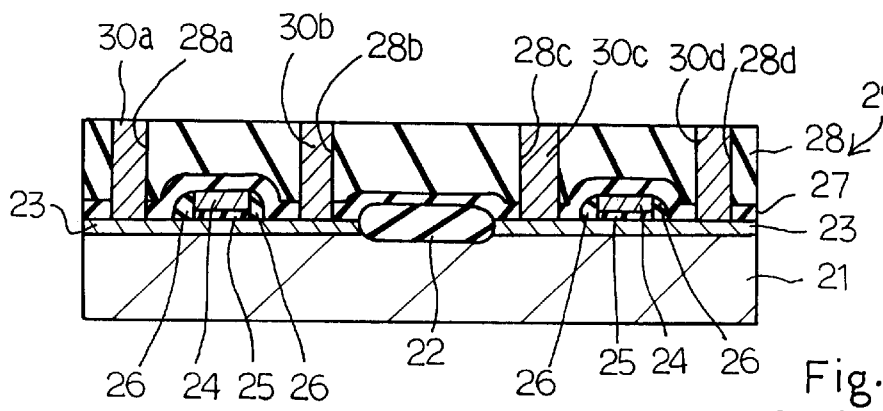
FIGS. 2A to 2C are cross sectional views showing the second prior art process of fabricating a semiconductor device.
Figure 2B:
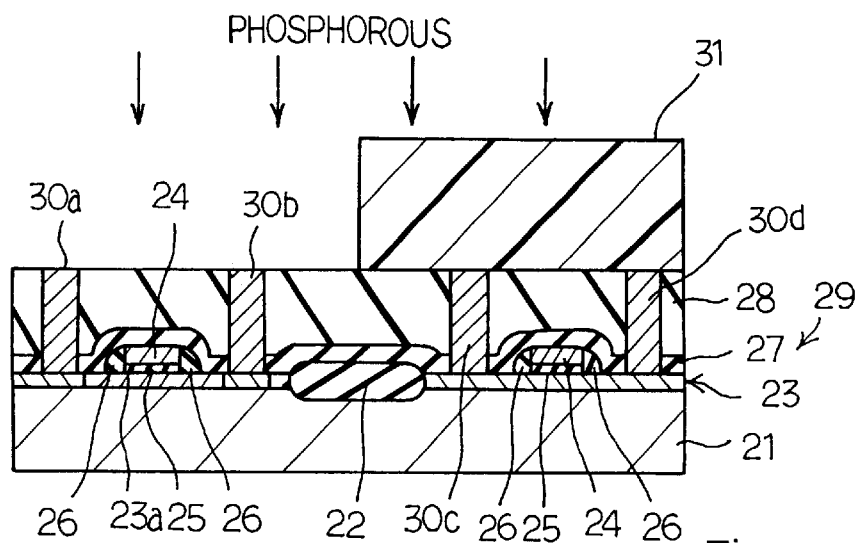
Figure 2C:
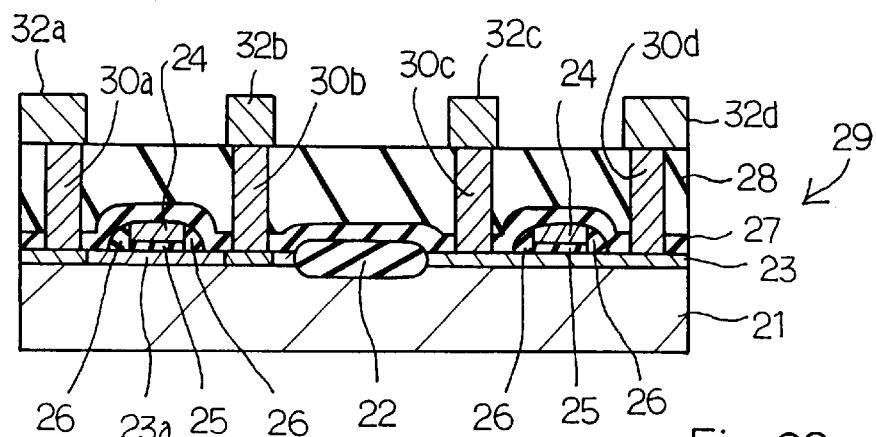

A hydrogen annealing or a post-metallization treatment is well known to a person skilled in the art. K. L Brower describes the hydrogen annealing in "Kinetics of $H_2$ passivation of Pb centers at the (111) Si-SiO$_2$ interface", Physical Review B, volume 38, number 14, pages 9657–9666, Nov. 15, 1988. The hydrogen annealing aims at reduction of surface state through deactivation of dangling bonds at the boundary between a silicon substrate and a gate oxide layer and neutralization of fixed surface charge in the gate oxide layer. When field effect transistors are subjected to the hydrogen annealing, dispersion of transistor characteristics is narrowed, and the threshold voltage is lowered rather than the threshold voltage of a field effect transistor not treated with hydrogen. It is impossible for semiconductor device manufacturers to deliver commercial products to user without the post-metallization treatment, because a large amount of surface state and a large amount of fixed charge make the semiconductor devices less reliable. It is not feasible to change the threshold voltage through the post-metallization treatment. The post-metallization treatment is the premise of the deactivation according to the present invention.

The change of threshold voltage through the post-metallization treatment is different phenomenon from change of threshold voltage through deactivation of the dopant impurity according to the present invention. According to the present invention, hydrogen ion partially deactivates the dopant impurity in the channel region, and the partially deactivated dopant impurity changes the threshold voltage of the field effect transistor. However, the dopant impurity in the channel region is never deactivated in the hydrogen annealing or the post-metallization treatment.

Deactivation of dopant impurity with hydrogen atom is, by way of example, reported by S. J. Pearton et.al. in "Hydrogen in Crystalline Semiconductors", Applied Physics, A43, pages 153–195. The paper proposes a deactivation model. Only acceptor impurity such as boron forms a silicon-boron-hydrogen cluster so as to deactivate the acceptor impurity. However, the deactivation effect is lost in heat treatment at 200 degrees in centigrade. As will be described hereinlater in detail, both of the donor impurity and the acceptor impurity are deactivated according to the present invention, and the deactivation is maintained after heat treatment between 300 degrees and 400 degrees in centigrade. Thus, the deactivation according to the present invention is achieved through a mechanism different from the deactivation mechanism disclosed in the paper. The present inventor thinks that both of hydrogen atom and crystal defects due to an ion-implantation relate to the deactivation according to the present invention.

A hydrogen treatment is disclosed in Japanese Patent Publication of Unexamined Application Nos. 63-299277 and 5-251378. The hydrogen treatment is carried out for deactivation of dangling bond in a semiconductor substrate. Japanese Patent Publication of Unexamined Application No. 63-299277 teaches a hydrogen treatment for a thin film transistor. Polysilicon layer is treated with hydrogen plasma so as to deactivate dangling bonds at grain boundaries of polysilicon, and there is no concept to deactivate dopant impurity. Japanese Patent Publication of Unexamined Application No. 5-251378 discloses a hydrogen annealing for curing semiconductor crystal damaged during an ion-implantation. The hydrogen deactivates the dangling bonds at the crystal defects due to the ion-implantation. Moreover, a polysilicon thin film is treated with hydrogen plasma proposed in Japanese Patent Publication of Unexamined Application No. 63-299277, and source/drain regions of a field effect transistor are doped with hydrogen in Japanese Patent Publication of Unexamined Application No. 5-25378. On the other hand, the threshold voltage control according to the present invention is carried out by implanting hydrogen ion into a channel region created by substantially perfect crystal structure, and the hydrogen ion-implantation is causative of crystal defect in the channel region. Thus, the hydrogen treatments disclosed in Japanese Patent Publication of Unexamined Application Nos. 63-299277 and 5-25378 are carried out for curing the semiconductor crystal, and do not relate to a threshold voltage control for a field effect transistor.

DESCRIPTION OF THE PREFERRED EMBODIMENTS

First Embodiment

Figure 3A:
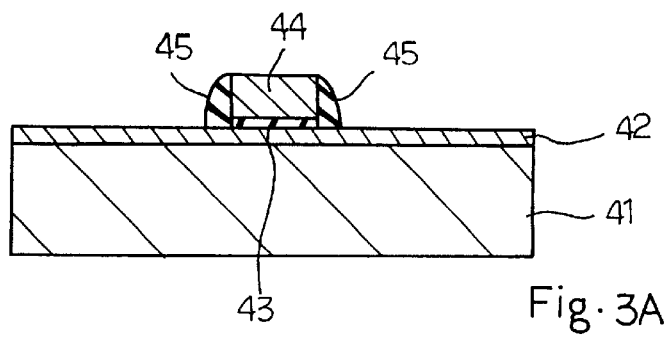
FIGS. 3A to 3C are cross sectional view showing a process for fabricating a semiconductor device according to the present invention.
Figure 3B:
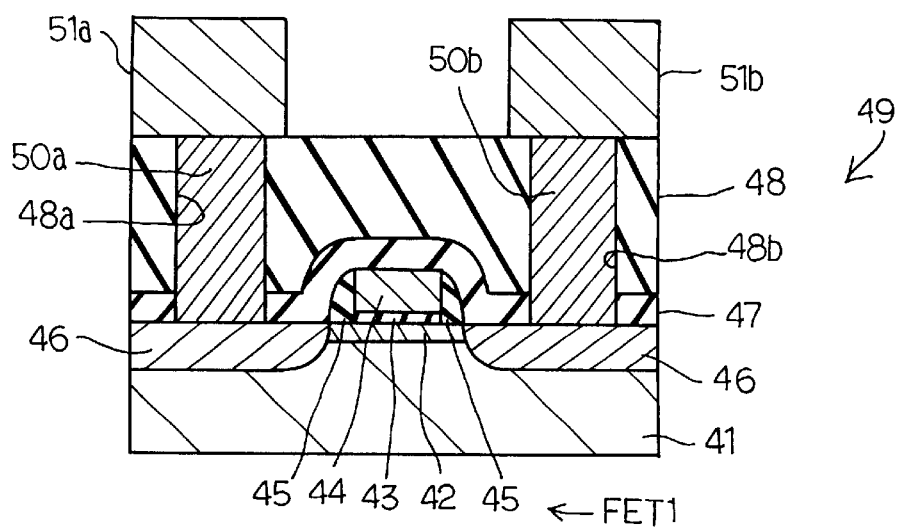
Figure 3C:
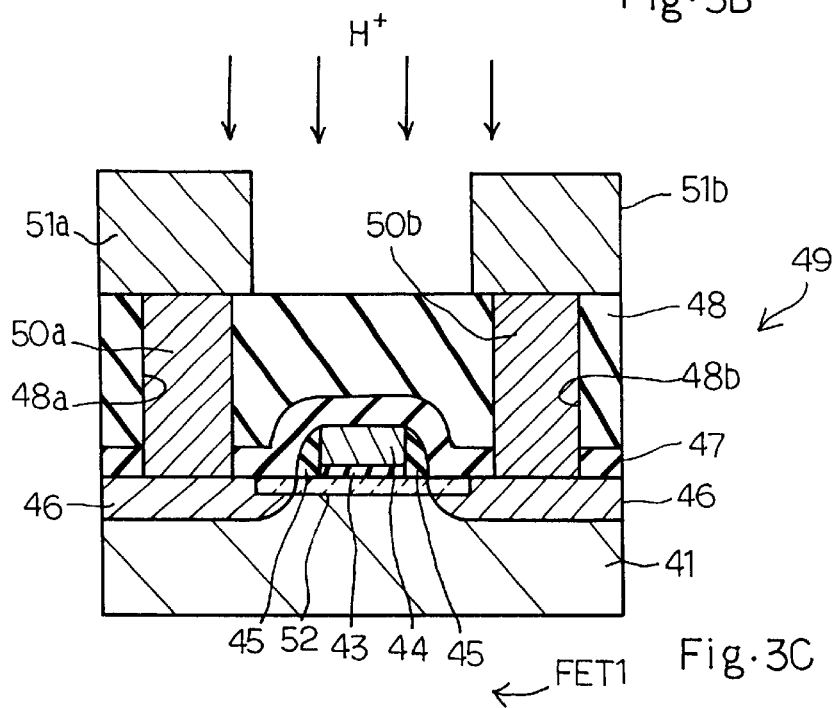

FIGS. 3A to 3C illustrate a process of fabricating a semiconductor device embodying the present invention. The semiconductor device has an n-channel type field effect transistor, and the present invention is applied to the n-channel type field effect transistor so as to correct the threshold voltage thereof. Description is hereinbelow focused on the n-channel type field effect transistor.

The process starts with preparation of a p-type silicon substrate 41 or a p-type well. Though not shown in the figures, a thick field oxide layer is selectively grown on the major surface of the p-type silicon substrate 41, and defines an active area assigned to the n-channel type field effect transistor. Boron is ion implanted into the active area, and forms a p-type doped channel region 42.

Subsequently, a surface portion of the active area is thermally oxidized, and a silicon oxide layer is grown on the active area. Polysilicon is deposited over the entire surface of the silicon oxide layer, and a polysilicon layer is laminated on the silicon oxide layer.

Photo-resist solution is spun onto the polysilicon layer, and is baked so as to form a photo-resist layer on the polysilicon layer. A pattern image for a gate electrode is transferred to the photo-resist layer, and forms a latent image in the photo-resist layer. The latent image is developed so as to form a photo-resist etching mask (not shown) on the polysilicon layer. Thus, the photoresist etching mask is patterned by using lithographic techniques. Using the photo-resist etching mask, the polysilicon layer and the silicon oxide layer are successively etched so as to form a gate oxide layer 43 and a gate electrode 44 on the p-type doped channel region 42.

Insulating material is deposited over the entire surface of the resultant semiconductor structure, and the gate electrode 44 is covered with the insulating layer. The insulating layer is anisotropically etched away, and side wall spacers 45 are formed from the insulating layer as shown in FIG. 3A.

Using the side wall spacers 45 and the gale electrode 44 as an ion-implantation mask, n-type dopant impurity is introduced into the active area, and n-type source/drain regions 46 are formed in the active area in a self-aligned manner with the side wall spacers 45. The n-type dopant impurity converts parts of the p-type doped channel region 42 from the p-type to n-type, and the p-type doped channel region 42 is left under the gate electrode 44 and the side wall spacers 45. The p-type doped channel region 42, the gate insulating layer 43, the gate electrode 44, the n-type source/drain regions 46 as a whole constitute an n-channel enhancement type field effect transistor FET1.

Insulating materials such as, for example, silicon oxide and boro-phosphosilicate glass are successively deposited over the resultant semiconductor structure, and form inter-level insulating layers 47 and 48. The interlevel insulating layers 47/48 as a whole constitute an inter-level insulating structure 49.

A photo-resist etching mask (not shown) is patterned on the inter-level insulating structure 49 by using the lithographic techniques, and areas over the n-type source/drain regions 46 are exposed to openings of the photo-resist etching mask. The inter-level insulating structure 49 is selectively etched away, and contact holes 48a/48b are formed in the inter-level insulating structure 49. The n-type source/drain regions 46 are exposed to the contact holes 48a/48b, respectively. The contact holes 48a/48b are plugged with conductive material such as, for example, tungsten, aluminum or polysilicon. The conductive material serve as plugs 50a/50b, which are held in contact with the n-type source/drain regions 46, respectively.

Aluminum or aluminum alloy is deposited over the entire surface of the inter-level insulating structure 49, and a photo-resist etching mask (not shown) is patterned on the aluminum layer by using the lithographic techniques. Using the photo-resist etching mask, the aluminum layer is selectively etched away, and the aluminum wiring strips 51a/51b are formed on the inter-level insulating structure 49 in such a manner as to be held in contact with the plugs 50a/50b. Though not shown in FIG. 3B, another aluminum wiring strip is connected through a conductive plug to the gate electrode 44.

After the formation of the aluminum wiring strips 51a/51b, the manufacturer connects the n-type source/drain regions 46 to suitable potential sources, and varies the potential level at the gate electrode 44. The manufacturer measures the drain current, and determines the threshold voltage of the n-channel enhancement type field effect transistor FET1.

Figure 4:
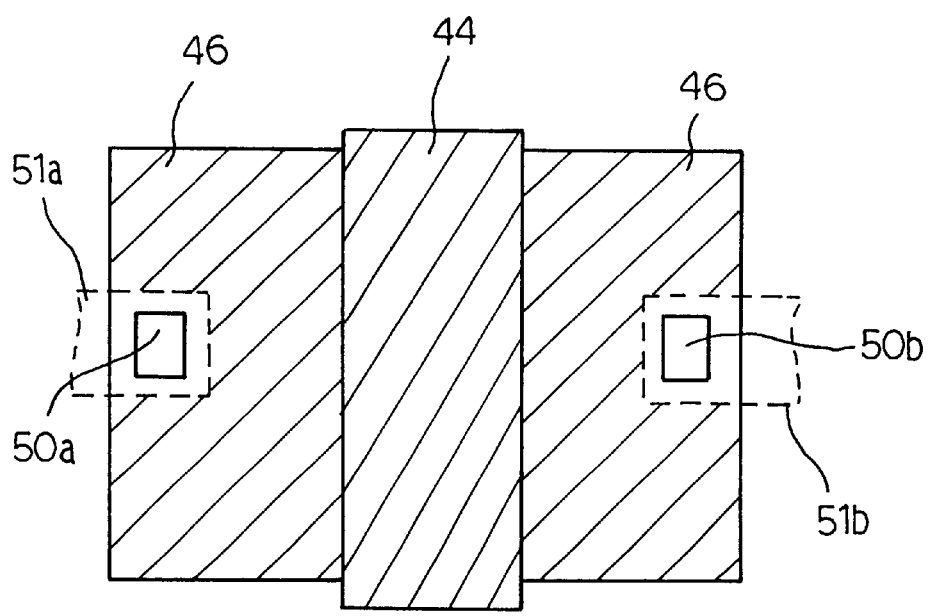
FIG. 4 is a plane view showing the area ion implanted with the hydrogen.

When the manufacturer finds the threshold voltage to be out of a design range, the manufacturer determines the dosage to be required for correction of the threshold voltage. Hydrogen ion is ion implanted into a surface portion 52 at the predetermined the dosage under acceleration energy of 75 KeV. The ion-implanted area is indicated by hatching lines in FIG. 4. Thereafter, the resultant semiconductor structure is treated in gaseous mixture of hydrogen and nitrogen at 400 degrees in centigrade for 20 minutes, and the heat treatment aims at reduction of the surface state and neutralization of trap centers. The surface state and the trap centers are generated through the aforesaid process sequence including the hydrogen ion-implantation. In this instance, the ratio between the hydrogen and the nitrogen is regulated to 1:1. However, the ratio is never limited to 1:1. Thus, the manufacturer completes the semiconductor device with the n-channel enhancement type field effect transistor.

The present inventor investigated the relation between the dosage and the variation of the threshold voltage for the field effect transistor. The present inventor fabricated samples of the n-channel type field effect transistors through the above described process and samples of a p-channel type field effect transistor through a process similar to the above described process. Reference samples were not subjected to the implantation of hydrogen ion, and only the heat treatment was carried at 400 degrees in centigrade for 20 minutes. The other samples were doped with the hydrogen ion at different dosage, and were treated at 400 degrees in centigrade for 20 minutes.

Figure 5:
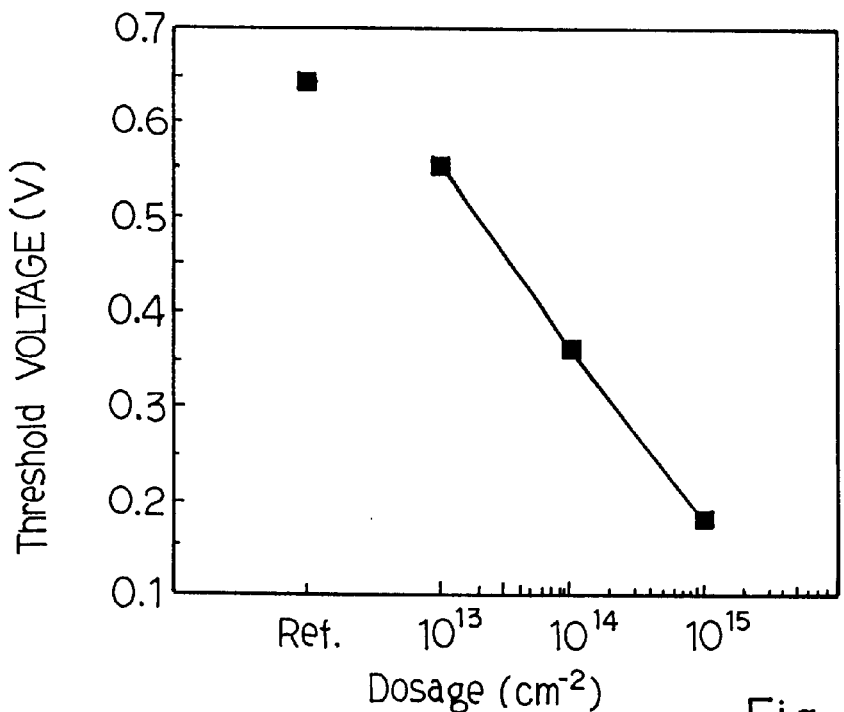
FIG. 5 is a graph showing relation between dosage and variation of threshold voltage of an n-channel type field effect transistor.
Figure 6:
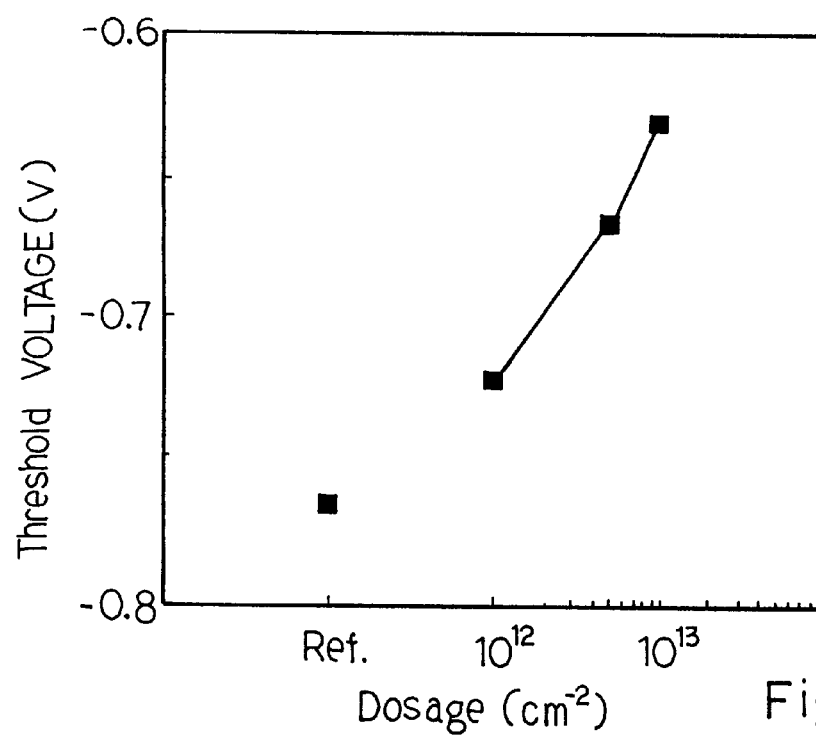
FIG. 6 is a graph showing relation between dosage and variation of threshold voltage of a p-channel type field effect transistor.

The present inventor measured the threshold voltage of each sample, and variation of threshold voltage in terms of the threshold voltage of the reference sample was plotted in FIGS. 5 and 6. FIG. 5 indicated the relation for the n-channel type field effect transistor, and the plots in FIG. 6 were representative of the variation for the p-channel type field effect transistor. When the hydrogen ion was ion implanted at the dosage of $1 \times 10^{15} cm^{-2}$, the variation of threshold voltage was of the order of 0.45 volt in absolute value. Even if the process parameters fluctuated, the variation of threshold voltage was of the order of 0.1 volt, and the variation due to the fluctuation was cured through the implantation of hydrogen ion at the dosage of $1 \times 10^{13} cm^{-2}$.

Figure 7:
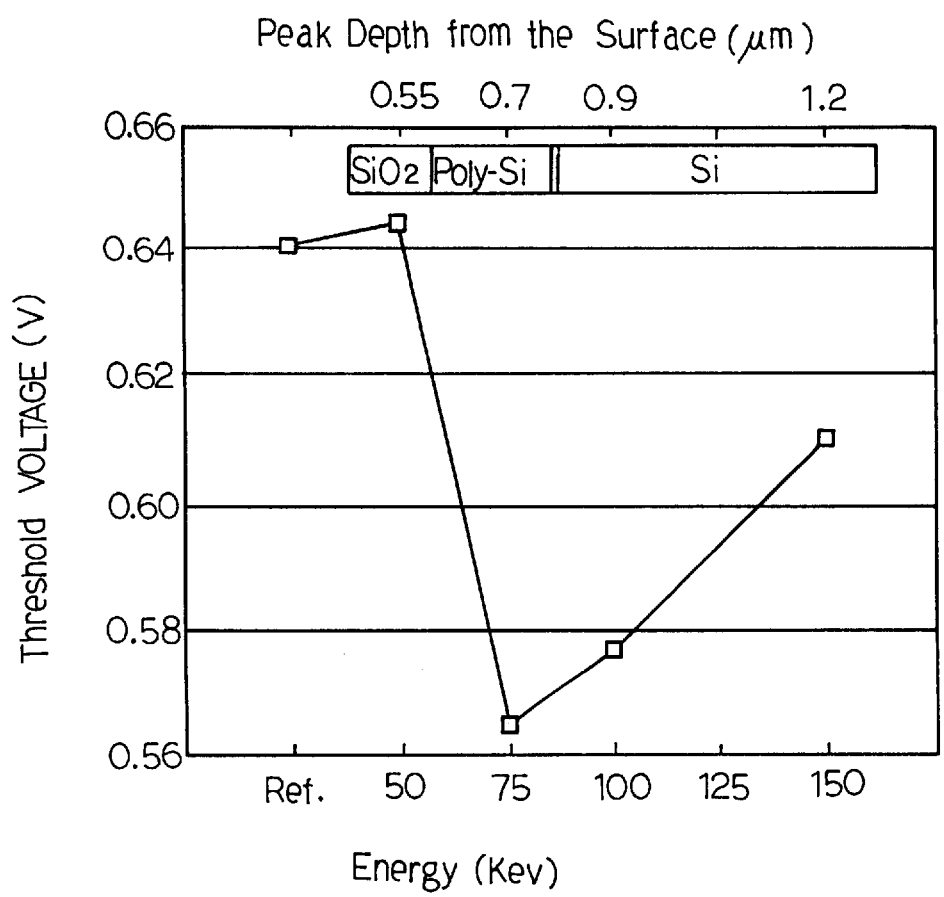
FIG. 7 is a graph showing the relation between acceleration energy, the peak depth of implanted hydrogen ion from the surface and the threshold voltage.
Figure 8:
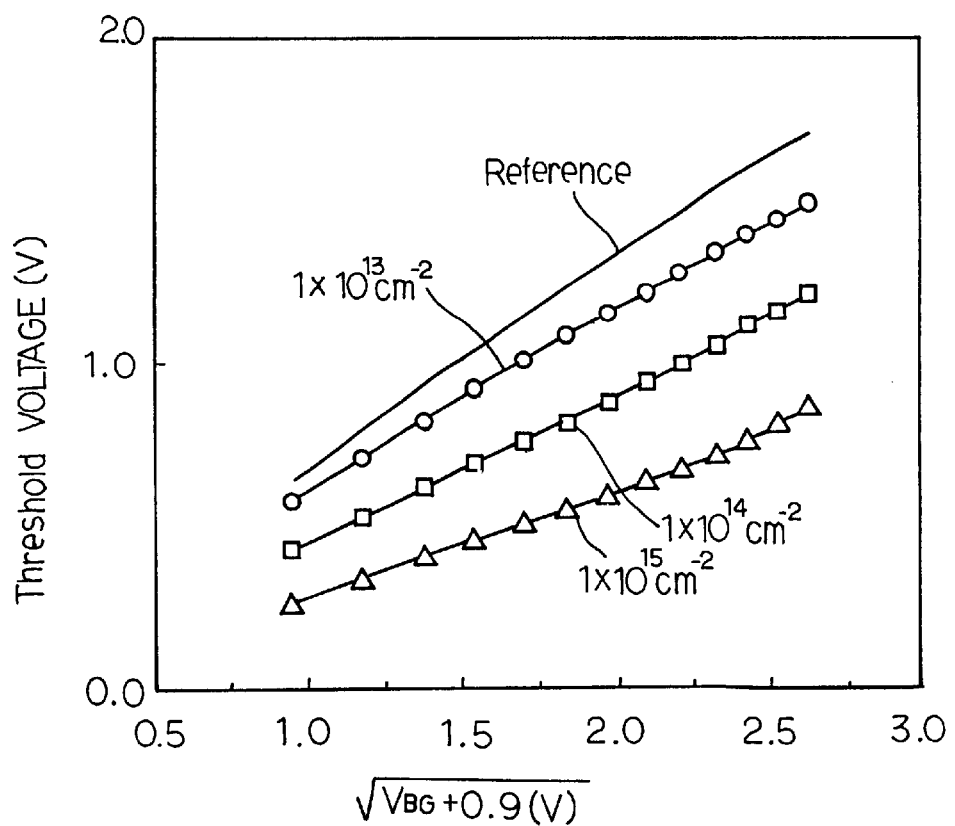
FIG. 8 is a graph showing relation between the backgate bias of a field effect transistor, the threshold voltage and the dosage of hydrogen ion.

The present inventor further investigated relation between the acceleration energy, the peak depth of the implanted hydrogen ion from the surface and the threshold voltage. The present inventor changes the acceleration energy, and measured the peak depth of the implanted hydrogen ion and the threshold voltage. The inter-level insulating layer 47, the gate electrode 44 and the silicon substrate 41 were indicated by "SiO$_2$", "Poly-Si" and "Si", respectively, in FIG. 7. When the peak depth was in the inter-level insulating layer 47, the variation of threshold voltage was little. On the other hand, when the hydrogen ion deeply penetrated into the silicon substrate 41, the variation of threshold voltage was relatively narrow. In order to widely change the threshold voltage, it was necessary for the hydrogen ion to reach the channel region or therearound. In the above described process, the peak depth was targeted at 0.8 micron, and the acceleration energy was regulated to 75 KeV.

The present inventor further investigated influences of the deactivation with the hydrogen ion on the threshold voltage of the n-channel enhancement type field effect transistor. As described in conjunction with the fabrication process, the boron was ion implanted into the surface portion, and formed the p-type doped channel region 42. The acceptor concentration affects the backgate characteristics of the field effect transistor. The present inventor prepared samples implanted with the hydrogen ion at different dosage. The present inventor changed the backgate bias $V_{BG}$, and measured the threshold voltage. The plots were labeled with the dosage, and the gradient of the plots was proportional to the acceptor concentration. The larger the gradient, the larger the acceptor concentration. From those plots, it was understood that the acceptor concentration was decreased when the dosage of hydrogen ion was increased. Thus, the hydrogen ion deactivated the dopant impurity in the channel region.

Figure 9:
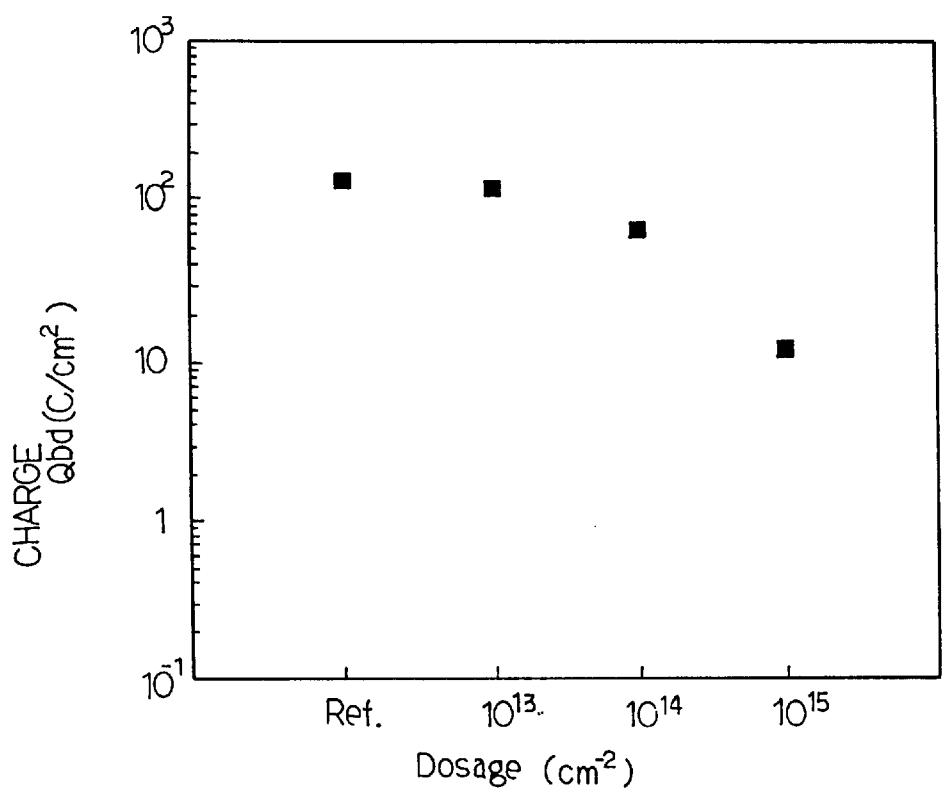
FIG. 9 is a graph showing dependency of amount of charge Qbd on the dosage.
Figure 10:
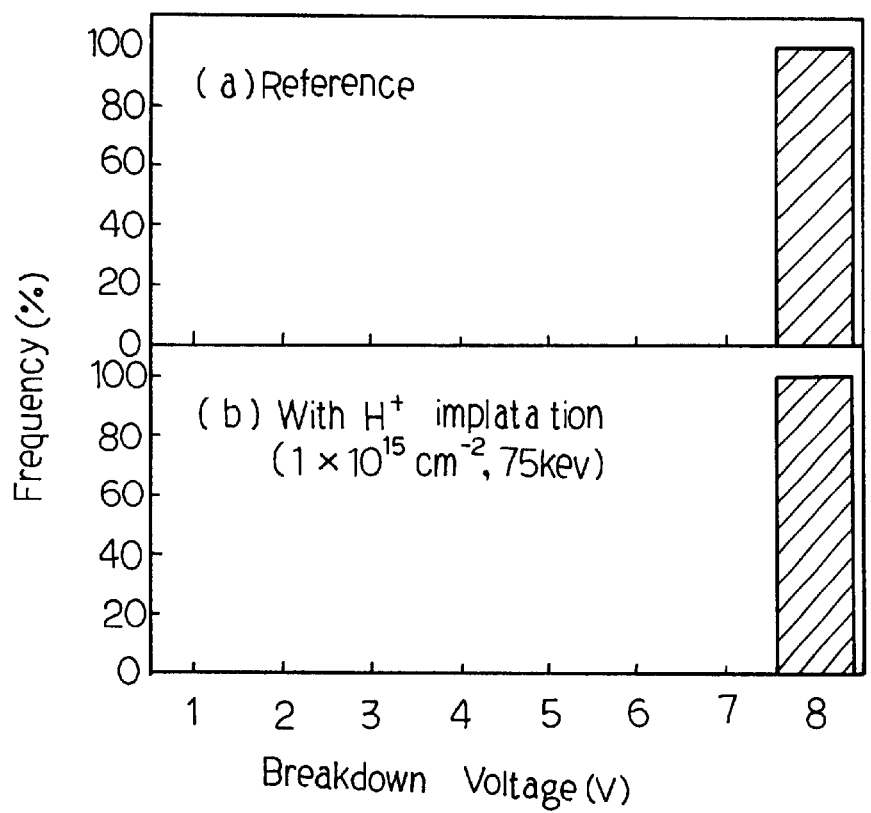
FIG. 10 is a graph showing dependency of breakdown voltage on the dosage.

The present inventor further investigated influences of the hydrogen ion on transistor characteristics. As shown in FIGS. 9 and 10, the hydrogen ion did not affect the reliability of the field effect transistor. The mass of hydrogen ion was so small that the implanted hydrogen ion could not seriously damage the gate oxide layer 43. For this reason, the damage was cured through the heat treatment at 400 degrees in centigrade. On the contrary, the boron and the phosphorous used in the second prior art process are so heavy that the crystal is never cured at the heat treatment around 400 degrees in centigrade.

Although the n-type source/drain regions 46 were also doped with the hydrogen ion, the present inventor confirmed that the hydrogen ion did not affect the transistor characteristics. The present inventor further confirmed that the hydrogen ion doped into the thick field oxide layer did not deteriorate the thick field oxide layer.

As will be understood from the foregoing description, the hydrogen ion deactivates the dopant impurity in the channel region, and changes the threshold voltage of the field effect transistor. The implantation of hydrogen ion is carried out after the formation of the aluminum wiring strips, and the manufacturer uses the ion-implantation for correcting the threshold voltage after the measurement of the threshold voltage. For this reason, the manufacturer rescues defective field effect transistors are rescued from the rejection by using the hydrogen ion-implantation, and the hydrogen ion-implantation improves the production yield of the semiconductor device.

Moreover, if a low-threshold voltage field effect transistor is mixed with high-threshold voltage field effect transistors, the manufacturer fabricates all the field effect transistors together, and selectively lowers the threshold voltage through the hydrogen ion-implantation. Thus, the threshold voltage control through the hydrogen ion-implantation makes the process sequence simple.

Second Embodiment

Figure 11A:
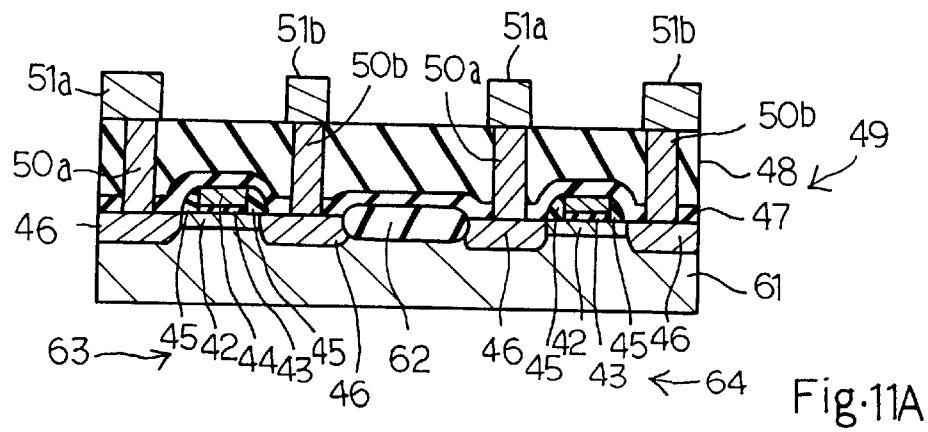
FIGS. 11A to 11C are cross sectional views showing another process sequence according to the present invention.
Figure 11B:
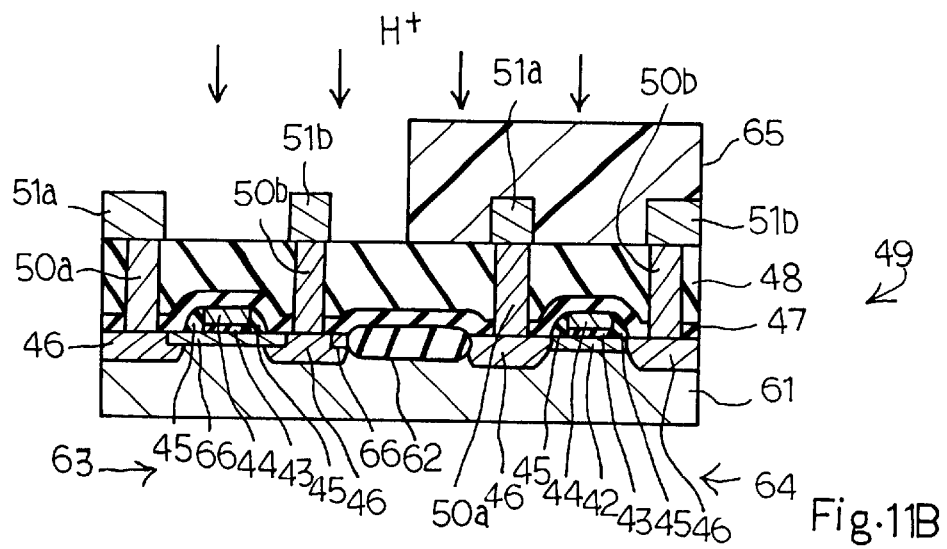
Figure 11C:
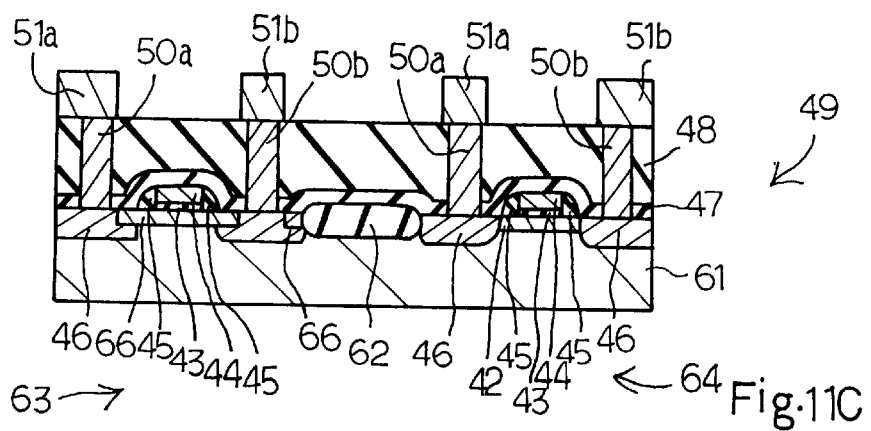

FIGS. 11A to 11C are cross sectional views showing another process embodying the present invention. The process implementing the second embodiment is used for fabricating field effect transistors different in threshold voltage on a semiconductor substrate. A mask ROM (read only memory) is, by way of example, fabricated through the process shown in FIGS. 11A to 11C, and the memory cell is assumed to be of the n-channel type.

The process starts with preparation of a p-type semiconductor substrate 61, and a field oxide 62 defines active areas. N-channel type field effect transistors 63/64 are fabricated in the active areas, and are similar in structure to the n-channel type field effect transistor FET1. For this reason, components of the n-channel type field effect transistor 63/64 are labeled with the same references designating corresponding components of the field effect transistor FET1 without detailed description.

The n-channel type field effect transistors 63/64 are covered with the inter-level insulating structure 49 or the inter-level insulating layers 47/48, and the contact holes are filled with the conductive plugs 50a/50b as similar to the first embodiment. The aluminum wiring strips 51/51b are patterned on the inter-level insulating structure 49, and are held in contact with the conductive plugs 50a/50b, respectively. The resultant semiconductor structure is shown in FIG. 11A.

Subsequently, the memory transistors 63/64 are programmed as follows. The n-channel type field effect transistor 63 is lowered in threshold voltage, and the other n-channel enhancement type field effect transistor 64 maintains the threshold voltage. A photo-resist ion-implantation mask 65 is patterned on the resultant semiconductor structure by using the lithographic techniques, and is regulated to 1.0 micron thick. The n-channel type field effect transistor 64 is covered with the photo-resist ion-implantation mask 65, and the other n-channel type field effect transistor 63 is uncovered. Hydrogen ion is implanted into the p-type doped channel region 42 at the dosage of at least $1\times10^{15} cm^{-2}$ under acceleration energy of 75 KeV. The hydrogen ion is peaked in the p-type doped channel region 42 and surface portions at the same depth of the n-channel type field effect transistor 63, and the region doped with the hydrogen ion is labeled with 66 in FIG. 11B. However, the photo-resist ion-implantation mask 65 prevents the other n-channel type field effect transistor 64 from the hydrogen ion, and the hydrogen ion is peaked in the inter-level insulating structure 49 over the n-channel type field effect transistor 64.

The photo-resist ion-implantation mask 65 is stripped off, and the resultant semiconductor structure is annealed under the same conditions as the first embodiment. The hydrogen ion deactivates the p-type dopant impurity in the region 66, and causes the threshold voltage of the n-channel type field effect transistor 63 to be at least 0.45 volt lower than the threshold voltage of the n-channel type field effect transistor 64. In this way, the mask ROM device is completed as shown in FIG. 11C.

In general, the mask ROM device requires two kinds of memory transistor for storing data bits. It is necessary for the two kinds of memory transistor to have large difference in threshold voltage. This means that the hydrogen ion is selectively ion implanted into the channel regions at high dosage. However, the hydrogen ion less damages the n-channel type field effect transistors. As shown in FIG. 9, the hydrogen ion at the dosage of $1\times10^{15} cm^{-2}$ decreases $Q_{BD}$ of the gate silicon oxide layer 43 to 10 $C/cm^2$. However, $Q_{BD}$ of 10 $C/cm^2$ is not a problem in practical usage, and the breakdown voltage is acceptable as shown in FIG. 10.

Figure 12A:
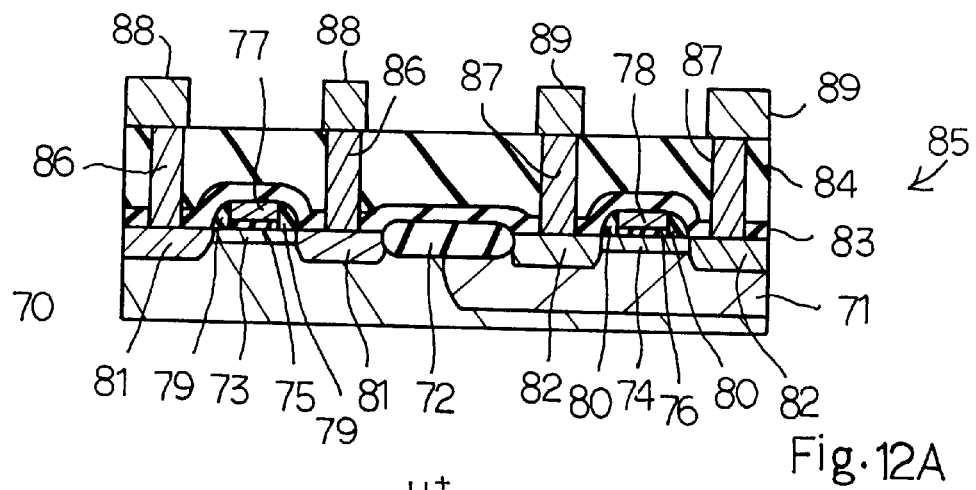
FIGS. 12A to 12C are cross sectional views showing yet another process sequence according to the present invention.
Figure 12B:
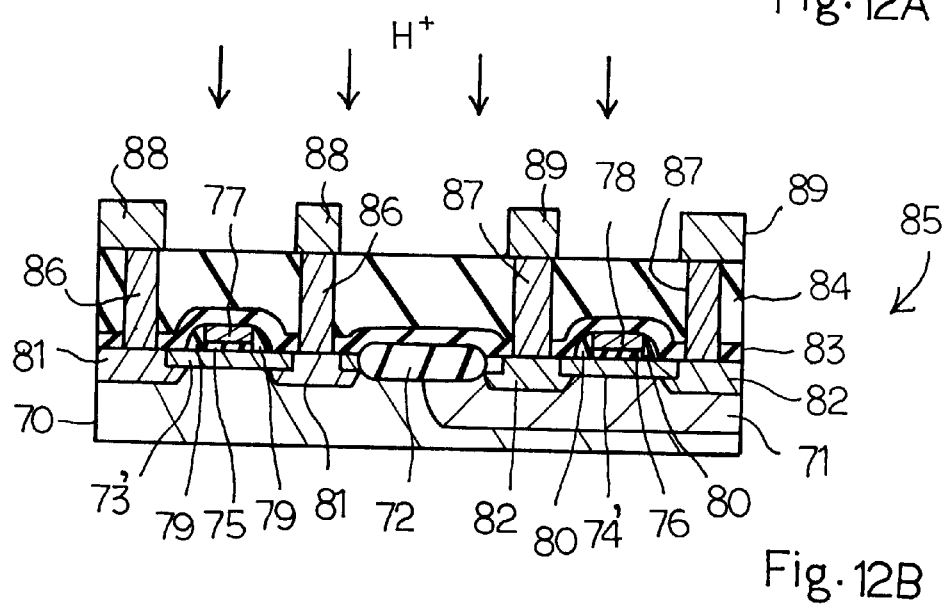
Figure 12C:
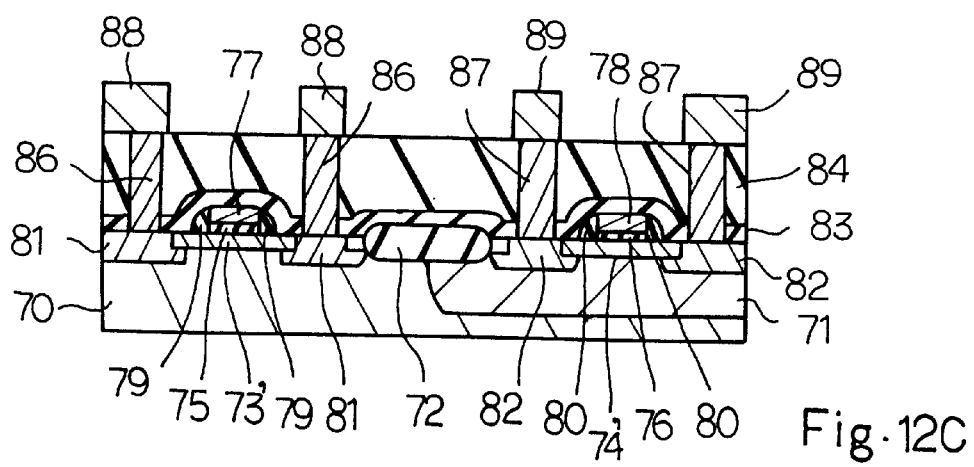

As will be appreciated from the foregoing description, the memory transistors 63/64 are programmed after the formation of the aluminum wiring strips 51a/51b, and the manufacturer shrinks the turn-around time or the term between the acceptance of order to the delivery to the user.
Third Embodiment FIGS. 12A to 12C illustrate yet another process embodying the present invention. A complementary transistor, i.e., a combination of an n-channel type field effect transistor and a p-channel type field effect transistor is fabricated through the process implementing the third embodiment.

The process starts with preparation of a p-type silicon substrate 70 or a p-type well, and an n-type well 71 is formed in a surface portion of the p-type silicon substrate 70. A thick field oxide layer 72 is selectively grown on the major surface of the p-type silicon substrate 70 and the n-type well 71 by using the LOCOS (local oxidation of silicon), and defines active areas assigned to an n-channel type field effect transistor and a p-channel type field effect transistor. P-type dopant impurity is introduced into a surface portion of the active area assigned to the n-channel type field effect transistor, and forms a p-type doped channel region 73. N-type dopant impurity is further introduced into the active area assigned to the p-channel type field effect transistor, and forms an n-type doped channel region 74.

Subsequently, gate insulating layers 75/76, gate electrodes 77/78 and side wall spacers 79/80 are formed over the doped channel regions 73/74 in a similar manner to the first embodiment. N-type dopant impurity is ion implanted into the active area assigned to the n-channel type field effect transistor, and n-type source/drain regions 81 are formed in a self-aligned manner with the side wall spacers 79. Similarly, p-type dopant impurity is ion implanted into the active area assigned to the p-channel type field effect transistor, and p-type source/drain regions 82 are formed in a self-aligned manner with the side wall spacers 80.

Insulating materials such as, for example, silicon oxide and boro-phosphosilicate glass are successively deposited over the resultant semiconductor structure, and form inter-level insulating layers 83 and 84. The interlevel insulating layers 83/84 as a whole constitute an inter-level insulating structure 85.

A photo-resist etching mask (not shown) is patterned on the inter-level insulating structure 85 by using the lithographic techniques, and areas over the n-type source/drain regions 81 and the p-type source/drain regions 82 are exposed to openings of the photo-resist etching mask. The inter-level insulating structure 85 is selectively etched away, and contact holes are formed in the inter-level insulating structure 85. The n-type source/drain regions 81 and the p-type source/drain regions 82 are exposed to the contact holes, respectively. The contact holes are plugged with conductive material such as, for example, tungsten, aluminum or polysilicon. The conductive material serve as plugs 86/87, which are held in contact with the n-type source/drain regions 81 and the p-type source/drain regions 82, respectively.

Aluminum or aluminum alloy is deposited over the entire surface of the inter-level insulating structure 85, and a photo-resist etching mask (not shown) is patterned on the aluminum layer by using the lithographic techniques. Using the photo-resist etching mask, the aluminum layer is selectively etched away, and the aluminum wiring strips 88/89 are formed on the inter-level insulating structure 85 in such a manner as to be held in contact with the conductive plugs 86/87 as shown in FIG. 12A. Though not shown in FIG. 3B, other aluminum wiring strips are connected through conductive plugs to the gate electrodes 77/78.

A photo-resist ion-implantation mask (not shown) is patterned on the inter-level insulating structure 85, and is uncovered with the area over the complementary field effect transistor.

Hydrogen ion is ion implanted into doped channel regions 73/74 under the same conditions as the first embodiment as shown in FIG. 12B. The peak depth is adjusted to the p-type doped channel region 73 and the n-type doped channel region 74.

The photo-resist ion-implantation mask is stripped off; and the resultant semiconductor structure is annealed under the same conditions as the first embodiment as shown in FIG. 12C. The hydrogen ion deactivates the p-type/n-type dopant impurities in the channel regions 73' and 74', and lowers the threshold voltage of the n-channel type field effect transistor and the threshold voltage of the p-channel type field effect transistor. Thus, the manufacturer completes the semiconductor device together with the complementary transistor.

As will be understood from the foregoing description, the hydrogen ion-implantation concurrently changes the threshold voltage of both of the n-channel type field effect transistor and the p-channel type field effect transistor. In a prior art process, the threshold voltage of the n-channel type field effect transistor and the threshold voltage of the p-channel type field effect transistor are individually changed through an ion-implantation with boron and another ion-implantation with phosphorous, and each ion-implantation requires a photo-resist ion-implantation mask for covering the other field effect transistor. Comparing the process sequence according to the present invention with the prior art process, it is clear that the threshold voltage control through the hydrogen ion-implantation is simpler than the prior art threshold voltage control.

If the dimensions of the gate electrodes 77 and 78 are larger than the design range, the threshold voltage of the n-channel type field effect transistor and the threshold voltage of the p-channel type field effect transistor become lower than target values. In this situation, the hydrogen ion-implantation concurrently lowers the threshold voltage of the n-channel type field effect transistor and the threshold voltage of the p-channel type field effect transistor, and rescues the product from rejection.

Although particular embodiments of the present invention have been shown and described, it will be obvious to those skilled in the art that various changes and modifications may be made without departing from the spirit and scope of the present invention.

Figure 13:
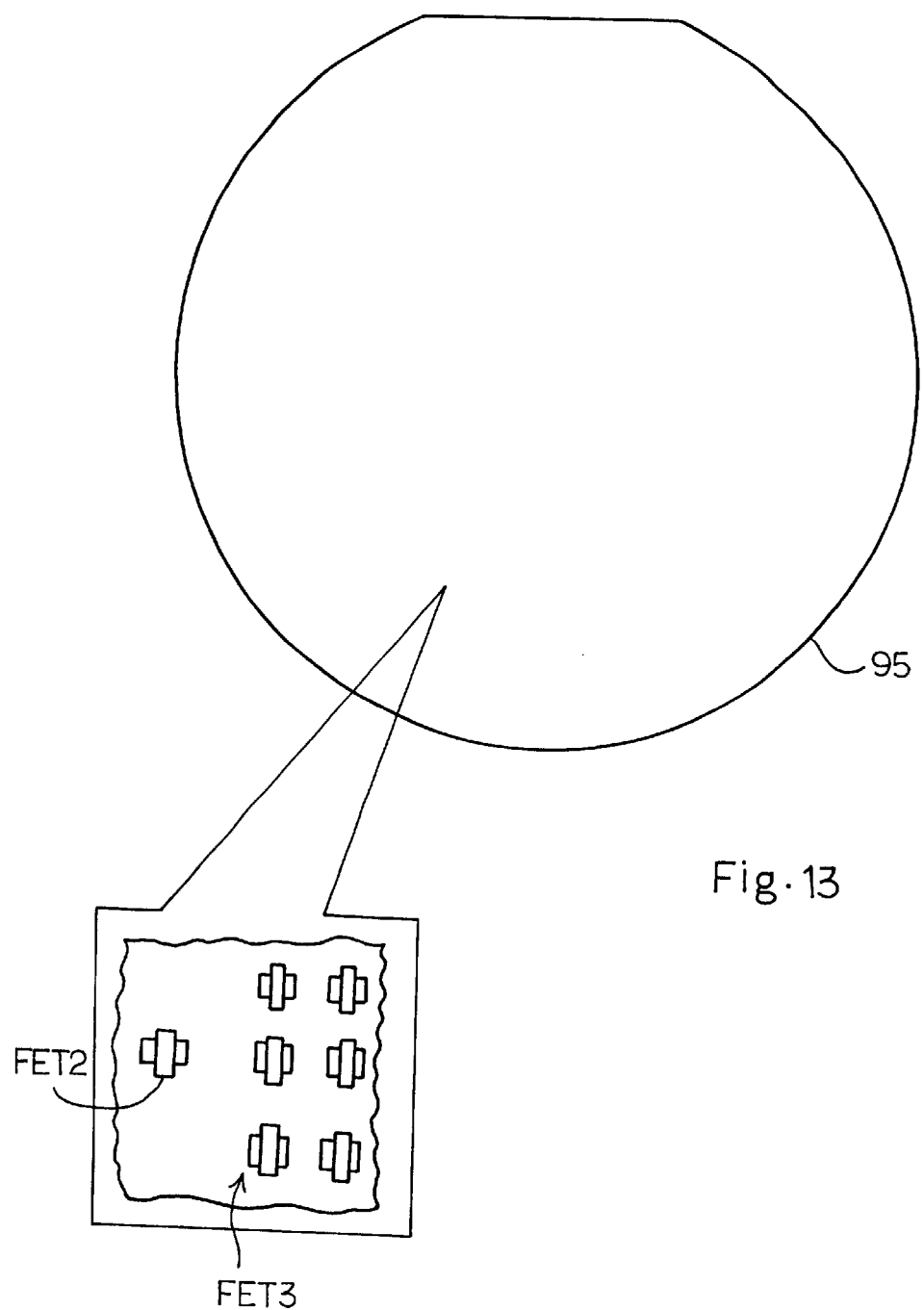
FIG. 13 is a schematic view showing a monitor field effect transistor provided for regular field effect transistors.

For example, the threshold voltage of field effect transistors may be estimated on the basis of the threshold voltage of a monitor field effect transistor FET2 fabricated on the same semiconductor wafer 95 together with regular field effect transistors FET3 forming parts of an integrated circuit as shown in FIG. 13. In this instance, the regular field effect transistors FET3 are not individually checked to see whether or not the threshold voltage falls within a design range, and the hydrogen ion-implantation is concurrently carried out for those regular field effect transistors FET3. It is preferable to fabricate the monitor field effect transistor FET2 as close to the regular field effect transistors FET3 as possible.

The monitor field effect transistor FET2 may be fabricated in an area close to high-speed field effect transistors. The high-speed field effect transistors usually have a low threshold voltage, and the manufacturer must strictly control the threshold voltage of the high-speed field effect transistors. Of course, when the hydrogen ion is implanted into the channel regions of the high-speed field effect transistors, other standard field effect transistors are masked with a photo-resist ion-implantation mask.

The hydrogen ion-implantation makes the threshold voltage of field effect transistors lower than the original level. For this reason, the original threshold voltage may be adjusted to a higher level than the target level.

In the embodiments described hereinbefore, the aluminum wiring strips and the photo-resist pattern serve as an ion-implantation mask. Any material is available for the ion-implantation mask in so far as it decelerates the hydrogen ion and changes the peak depth.

The gate electrode of the field effect transistor may have a salicide structure such as, for example, a tungsten silicide layer laminated on a polysilicon layer. In this instance, the refractory metal silicide decelerates the hydrogen ion, and the acceleration energy is increased so as to focus the hydrogen ion on the channel region.

A second inter-level insulating structure and a third inter-level insulating structure may be laminated on the aluminum wiring strips. Even though, the hydrogen ion penetrates the first to third inter-level insulating structures under large acceleration energy, and reaches the channel region.

Although the hydrogen ion does not affect the insulating characteristics of the thick field oxide layer as described hereinbefore, the thick field oxide layer may be covered with the photo-resist ion-implantation mask.

What is claimed is:

1. A process for fabricating a semiconductor device, comprising the steps of:
 a) fabricating at least one MOS transistor having at least a gate insulating layer, a gate electrode, a source region, a channel region and a drain region on a semiconductor substrate;
 b) forming an inter-level insulating layer for covering at least said MOS transistor;
 c) forming contact holes in said inter-level insulating layer in such a manner that portions of said source regions and said drain regions of said MOS transistor are exposed;
 d) burying at least some of said contact holes with portions of a wiring layer;
 e) introducing hydrogen in such a manner that the hydrogen concentration is maximized in said channel region of said MOS transistor; and
 f) treating the resulting structure with heat,
 wherein a threshold voltage of said MOS transistor is measured after the formation of said wiring layer, and the dose of said hydrogen is determined on the basis of a difference between said threshold voltage and a target threshold voltage.

2. The process for fabricating a semiconductor device as set forth in claim 1, wherein said hydrogen is introduced by ion implantation of hydrogen ions.

3. The process for fabricating a semiconductor device as set forth in claim 2, wherein said hydrogen ions are ion implanted at an energy selected to maximize the number of hydrogen ions of said dose that are disposed in said channel region of said MOS transistor.

4. The process for fabricating a semiconductor device as set forth in claim 1, wherein said at least one MOS transistor is an n-channel type field effect transistor.

5. The process for fabricating a semiconductor device as set forth in claim 1, wherein said at least one MOS transistor is a p-channel type field effect transistor.

6. The process for fabricating a semiconductor device as set forth in claim 1, wherein said at least one MOS transistor includes at least an n-channel type field effect transistor and at least a p-channel field effect transistor.

7. The process for fabricating a semiconductor device as set forth in claim 6, wherein said at least one MOS transistor are wired in a complementary MOS method with an n-channel type field effect transistor connected to a p-channel field effect transistor.

8. The process for fabricating a semiconductor device as set forth in claim 1, wherein said at least one MOS transistor is a part of a memory cell structure.

9. The process for fabricating a semiconductor device as set forth in claim 8, wherein said memory cell is a read only memory.

10. The process for fabricating a semiconductor device as set forth in claim 8, wherein said memory cell is a random access memory.

11. The process for fabricating a semiconductor device as set forth in claim 10, wherein said memory cell is a static random access memory.

12. The process for fabricating a semiconductor device as set forth in claim 1, wherein said heat for treating the resultant structure is performed using a mixture of hydrogen and nitrogen at approximately 400 degrees centigrade for twenty minutes.

13. The process for fabricating a semiconductor device as set forth in claim 12, wherein said mixture is a 1:1 ratio between the hydrogen and nitrogen.

14. The process for fabricating a semiconductor device as set forth in claim 3, wherein said hydrogen ions are ion implanted at an energy of 75 KeV.

15. A process for fabricating a semiconductor device, comprising the steps of:
   (a) fabricating a plurality of MOS transistor and at least one monitor MOS transistor on a semiconductor substrate;
   (b) measuring a threshold voltage of said monitor MOS transistor;
   (c) determining a dose of hydrogen ion for an ion implantation process on the basis of a difference between said threshold voltage and a target threshold voltage; and
   (d) introducing hydrogen ion into at least one of said plurality of MOS transistors at said dose to control a threshold voltage of said at least one of said plurality of MOS transistors.

16. The process for fabricating a semiconductor device as set forth in claim 15, wherein an implantation of said hydrogen ion is carried out under the condition that at least one of said plurality of MOS transistors is covered with a mask.

17. The process for fabricating a semiconductor device as set forth in claim 16, wherein said hydrogen ions are ion implanted at an energy selected to maximize the number of hydrogen ions of said dose that are disposed in said channel region of said MOS transistor and not to substantially penetrate said mask.

18. The process for fabricating a semiconductor device as set forth in claim 15, wherein at least one MOS transistor of said plurality of transistors is an n-channel type field effect transistor.

19. The process for fabricating a semiconductor device as set forth in claim 15, wherein at least one MOS transistor is a p-channel type field effect transistor.

20. The process for fabricating a semiconductor device as set forth in claim 15, wherein said plurality of MOS transistors includes at least one n-channel type field effect transistor and at least one p-channel field effect transistor.

21. The process for fabricating a semiconductor device as set forth in claim 20, wherein said MOS transistors are wired in a complementary MOS method with an n-channel type field effect transistor connected to a p-channel field effect transistor.

22. The process for fabricating a semiconductor device as set forth in claim 15, wherein at least one MOS transistor is a part of a memory cell structure.

23. The process for fabricating a semiconductor device as set forth in claim 22, wherein said memory cell is a read only memory.

24. The process for fabricating a semiconductor device as set forth in claim 22, wherein said memory cell is a random access memory.

* * * * *